March 5, 1968 H. SCHÄFER 3,372,067

METHOD OF FORMING A SEMICONDUCTOR BY MASKING AND DIFFUSION

Filed Feb. 25, 1964 2 Sheets-Sheet 1

Jnventor:
Horst Schäfer
By: Spencer & Kaye
ATTORNEYS

METHOD OF FORMING A SEMICONDUCTOR BY MASKING AND DIFFUSION

Filed Feb. 25, 1964 2 Sheets-Sheet 2

Inventor:
Horst Schäfer
By: Spencer & Kaye
ATTORNEYS

United States Patent Office 3,372,067

Patented Mar. 5, 1968

3,372,067

METHOD OF FORMING A SEMICONDUCTOR BY MASKING AND DIFFUSION

Horst Schäfer, Herrlingen, Germany, assignor to Telefunken Patentverwertungsgesellschaft m.b.H., Ulm (Danube), Germany Filed Feb. 25, 1964, Ser. No. 347,260
Claims priority, application Germany, Feb. 25, 1963, T 23,520
25 Claims. (Cl. 148—187)

The present invention relates to semiconductors, and, more particularly, to a method for producing a diffusion mask or a protective coating or layer on a semiconductor body made of germanium or a Group 3–Group 5 compound, such as GaP, GaAs, GaSb, InAs, InP, or AlSb.

It has already been proposed to provide a diffusion mask on a germanium body by applying a layer of SiO. Experiments have shown, however, that substances such as the SiO which are applied onto semiconductor bodies as diffusion masks, in the form of compounds, are permeable for all doping agents except phosphorous, so that masks of this type do not provide a satisfactory masking effect.

It is, therefore, the primary object of the present invention to overcome the above drawback, and, accordingly, the present invention resides in the fact that there is applied onto the semiconductor body a material, in elemental form, which material is different from the basic semiconductor material, whereafter this material is converted into a compound which prevents diffusion of impurities and which is effective to protect the surface of the semiconductor body. If possible, the material applied, in elemental form, to the semiconductor body should correspond, crystallographically, with the semiconductor body. If the semiconductor body is germanium, a masking layer impervious to the most common doping agents, such as phosphorous, arsenic, gallium or boron, is obtained by first applying onto the germanium body a layer of silicon, after which this layer, originally constituted of elemental silicon, is converted into an $SiO_2$ layer while it is on the semiconductor. Oxidizing an already applied silicon layer also produces an impervious and water-insoluble diffusion mask or protective layer on semiconductor bodies made of a Group 3–Group 5 compound.

Instead of semiconductor material, the protective layer or diffusion mask can be made by applying a metal such as copper or nickel onto the semiconductor body. These metals are then transformed, for example, into oxides or sulfides.

The silicon layer can be applied onto the semiconductor body made of germanium or a Group 3–Group 5 compound in any one of various ways. For example, by vaporizing, by galvanic precipitation, or by the precipitation formed upon the thermal decomposition of a silicon compound, as, for example, $SiCl_4$. The silicon layer on the semiconductor body can be oxidized, for example, by decomposing an oxygen-yielding compound, or by thermal or anodic oxidation.

Figure 1:
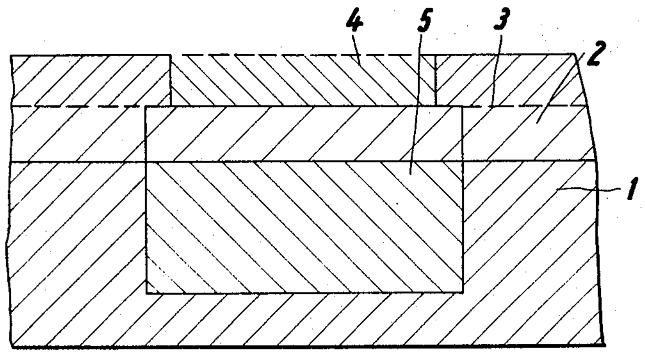
Figure 2:
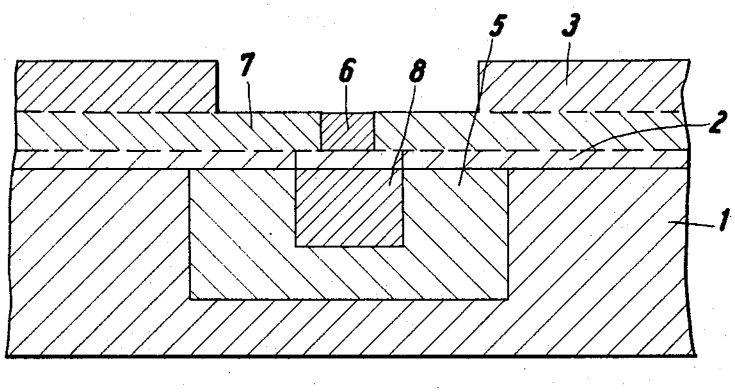
Figure 3:
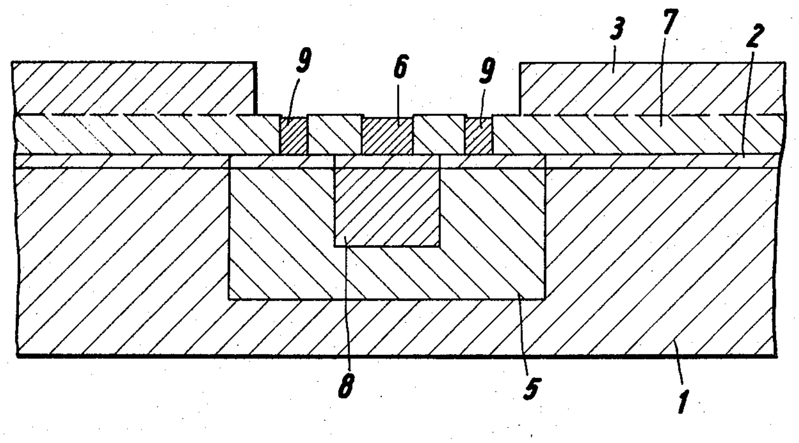

Additional objects and advantages of the present invention will become apparent upon consideration of the following description when taken in conjunction with the accompanying drawings in which:

FIGURES 1, 2 and 3 are sectional views showing three stages during the manufacture of a transistor whose zones of different conductivity types are created by diffusing impurities into the starting body while the latter is masked with a diffusion-resistant mask or protective coating applied in accordance with the present invention.

Referring now to the drawings, FIGURE 1 shows a planar transistor having a germanium body 1 whose conductivity type is that of the collector zone. The body 1 is provided with a silicon layer 2 part of which is subsequently oxidized for producing an oxide mask. During this oxidation, there is formed an oxide layer 3 whose thickness is approximately half that of the thickness of the silicon layer 2. If, then, by way of example, the silicon layer 2 has a thickness of $1\mu$, the oxide layer 3 has a thickness of $0.5\mu$.

In order that the impurities which are to be diffused into the germanium body can be freely diffused into the semiconductor surface, that portion of the oxide layer which lies in the region of the diffusion has to be removed. This, in the case of base diffusion, is the region 4 of the oxide layer of FIGURE 1. The region 4 can be removed, for example, by etching in a watery solution containing HF and $(NH_4)_2F_2$. Those parts of the oxide layer which are not to be etched away will, of course, be covered with a suitable etch-resistant lacquer. This lacquer may, as is conventional, be applied by a photolithographic process in such a manner as to cover those portions of the oxide layer which are not to be etched away.

After a diffusion window has been etched out of the oxide mask, the base zone 5 is diffused into the germanium body 1. If the germanium body of the conductivity type of the collector zone is n-conductive, the base zone can be made, for example, by diffusing boron. The boron first penetrates the silicon layer still remaining after the oxidation, and only then diffuses into the germanium body proper. Generally, this diffusion is accompanied by a further oxidation of the silicon, if, as is conventional, an oxide is used for impuritty diffusion, or if the diffusion occurs in an oxygen-containing atmosphere.

Inasmuch as the emitter diffusion requires a smaller window in the oxide layer than does the base diffusion, further oxidation has to take place after the base diffusion, Accordingly, a new window 6, suited for the emitter diffusion and shown in FIGURE 2, has to be etched out of the oxide layer 7 which has formed as the result of this further oxidation. After this second oxidation, the thickness of the silicon layer 2, which was $0.5\mu$ at the end of the first oxidation, is reduced further to about between 0.05 and $0.1\mu$. This second oxidation also enlarges the first oxide layer, in that region where the oxide layer was not removed, by a thickness corresponding to that of the oxide layer 7.

The emitter impurities are now diffused through the emitter window 6, to penetrate first the silicon layer 2, which, as aforesaid, is now but 0.05 to $0.1\mu$ thick, and then the germanium body proper. This diffusion produces the emitter zone 8. Assuming the germanium body to be n-conductive, the emitter zone can be produced by diffusing, for example, phosphorous.

After the emitter diffusion, the diffused zones in the semiconductor body still have to be contacted. This contacting can be effected, for example, by means of aluminum electrodes which, as shown in FIGURE 3, are alloyed into the window 6 for producing the emitter lead, and, after a preferably annular window 9 has been etched out of the oxide layer, into this window for producing the base lead. This is done, for example, by evaporating and depositing aluminum onto the surface of the semiconductor body, this depositing being done not selectively, i.e., without masking, but onto the entire surface portion on the emitter side. The aluminum is alloyed at a temperature of approximately 450 to 500° C. Before this heat treatment is carried out, however, the deposited aluminum, except for that in the windows, has to be removed. This excess aluminum can be removed by applying suitable etch-resistant photomasking and then etching away the exposed metal.

The use of silicon on a semiconductor body made of germanium or a Group 3–Group 5 compound has the advantage that the silicon is crystallographically compatible with the slab and therefore does not result in any significant impurities. A further advantage of using silicon is that it lends itself particularly well to being oxidized, and that it forms an excellent oxide mask.

The present invention is not limited to the manufacture of transistors but is equally applicable to the manufacture of other types of semiconductor junctions, e.g., diodes, whose zones of different conductivity type were formed by diffusion after the application of a diffusion mask or protective layer in accordance with the above-described method.

It will be understood that the above description of the present invention is susceptible to various modifications, changes and adaptations, and the same are intended to be comprehended within the meaning and range of equivalents of the appended claims.

The following are several further illustrative examples of the present invention:

EXAMPLE I

A slab of n-type gallium arsenide is provided, by vaporization, with a coating of aluminium, having a thickness of 1 micron. This coating is oxidized by heating it in air at a temperature of about 700° C. for approximately 200 seconds. An etch-resistant lacquer is applied, photographically, over those portions of the aluminium oxide where no impurity diffusion is to occur, after which the non-protected aluminium oxide is etched away. Zinc is then diffused through the thus-formed window to form a conductivity zone of the type opposite to that of the remainder of the slab. The two zones are then contacted by electrodes made of nickel, to complete the diode.

EXAMPLE II

A slab of silicon carbide of p-type-conductivity is provided, by vaporization, with a coating of zirconium, having a thickness of 1 micron. This coating is oxidized by heating it in air at a temperature of about 1200° C. for approximately 200 seconds. An etch-resistant lacquer is applied, photographically, over those portions of the zirconium oxide where no impurity diffusion is to occur, after which the non-protected zirconium oxide is etched away. Nitrogen is then diffused through the thus-formed window to form a conductivity zone of the type opposite to that of the remainder of the slab. The two zones are then contacted by electrodes made of nickel, to complete the diode.

What is claimed is:

1. A method of providing a semiconductor which is made of a material selected from the group consisting of germanium and the Group 3–Group 5 compounds with a diffusion mask or protective layer, said method comprising the steps of applying onto the semiconductor body a layer of a material, in elemental form, which material is different from that of which the semiconductor body is made, and thereafter converting the applied layer into an oxide having the characteristics of the diffusion mask or protective layer with which the semiconductor body is to be provided.

2. A method as defined in claim 1 wherein said layer is made of a material having the same crystallographic characteristics as the semiconductor body.

3. A method as defined in claim 1 wherein the elemental layer is a metal.

4. A method as defined in claim 1 wherein the elemental layer is a semiconductor material.

5. A method as defined in claim 1 wherein the semiconductor body is made of gallium arsenide.

6. A method as defined in claim 1 wherein the elemental layer is silicon and wherein at least part of the silicon layer is converted into said compound by oxidation.

7. A method as defined in claim 6 wherein the silicon layer is applied by vaporization.

8. A method as defined in claim 6 wherein the silicon layer is applied by galvanic precipitation.

9. A method as defined in claim 6 wherein the silicon layer is applied by thermal decomposition of a silicon compound.

10. A method as defined in claim 6 wherein the silicon layer has a thickness of between 1 and 2 $\mu$.

11. A method as defined in claim 6 wherein the silicon layer is oxidized by thermal oxidation.

12. A method as defined in claim 6 wherein the silicon layer is oxidized by anodic oxidation.

13. A method as defined in claim 6 wherein the silicon layer is oxidized by decomposing an oxygen-yielding compound and treating the silicon layer with the thus liberated oxygen.

14. A method as defined in claim 6 wherein the silicon layer is oxidized throughout but a portion of its thickness.

15. A method as defined in claim 1 wherein the semiconductor body is prospectively a transistor body and wherein the elemental layer is applied to the prospective emitter side of the semiconductor body.

16. A method as defined in claim 15 wherein the transistor body is a planar transistor body.

17. A method of making a transistor, comprising the steps of: applying onto a semiconductor body made of a material selected from the group consisting of germanium and the Group 3–Group 5 compounds a layer of silicon in elemental form; oxidizing the silicon layer throughout a portion of its thickness; etching a base-diffusion window through the silicon oxide layer; diffusing impurities through said window and through the remaining silicon layer into the semiconductor body for forming the base zone; thereafter again oxidizing the remaining silicon layer throughout at least a portion of its thickness; etching an emitter-diffusion window through the last-created silicon oxide layer; and diffusing impurities through said last-mentioned window and through any remaining silicon layer into the semiconductor body for forming the emitter zone.

18. A method as defined in claim 17, comprising the further steps of alloying an emitter lead into the emitter window; etching out of the last-created silicon oxide layer a further window which is in alignment with the base zone; and alloying a base lead into the base window.

19. A method as defined in claim 18 wherein said leads are made of aluminum.

20. A method of providing a semiconductor body made of silicon carbide with a diffusion mask or protective layer, said method comprising the steps of applying onto the semiconductor body a layer of a material, in elemental form, which material is different from that of which the semiconductor body is made, and thereafter converting the applied layer into a compound having the characteristics of the diffusion mask or protective layer with which the semiconductor body is to be provided.

21. A method of providing a semiconductor body with a diffusion mask or protective layer, said method comprising the steps of applying onto the semiconductor body a layer of a material, in elemental form, which material is different from that of which the semiconductor body is made, and thereafter converting the applied layer into a compound having the characteristics of the diffusion mask or protective layer with which the semiconductor body is to be provided, said elemental layer being aluminum and at least part of the aluminum layer being converted into said compound by oxidation.

22. A method of providing a semiconductor body with a diffusion mask or protective layer, said method comprising the steps of applying onto the semiconductor body a layer of a material, in elemental form, which material is different from that of which the semiconductor body is made, and thereafter converting the applied layer into a compound having the characteristics of the diffusion mask or protective layer with which the semiconductor body is to be provided, said element layer being zirconium and at least part of the zirconium layer being converted into said compounds by oxidation.

23. In a method of making a semiconductor junction, the steps of: applying onto the semiconductor body of one conductivity type a layer of a material, in elemental form, which material is different from that of which the semiconductor body is made; and thereafter converting the applied layer into an oxide compound having the characteristics of a diffusion mask for preventing the diffusion of impurities which convert a portion of the semiconductor body into a zone of the opposite conductivity type.

24. A method of providing a semiconductor body with a diffusion mask or protective layer, said method comprising the steps of applying onto the semiconductor body a layer of a metal, in elemental form which metal is a material different from that of which the semiconductor body is made, and thereafter converting the applied layer into a compound having the characteristics of the diffusion mask or protective layer with which the semiconductor body is to be provided, said compound being selected from the group consisting of metal oxide and metal sulfide.

25. The method defined in claim 23 wherein the semiconductor body is made of a material selected from the group consisting of germanium and the Group 3–Group 5 compounds, wherein the elemental material is silicon, and wherein the converted layer is silicon oxide.

References Cited

UNITED STATES PATENTS

| | | | |
|---|---|---|---|
| 2,981,646 | 4/1961 | Robinson | 148—187 |
| 3,055,776 | 9/1962 | Stevenson | 148—187 X |
| 3,139,361 | 6/1964 | Rasmanis | 117—200 |
| 2,739,276 | 3/1956 | Irby | 117—200 |
| 2,827,401 | 3/1958 | Laughlin | 117—200 |
| 3,158,505 | 11/1964 | Sandor | 117—215 |
| 3,200,019 | 8/1965 | Scott | 148—187 X |
| 3,221,199 | 11/1965 | Yanagisawa | 117—212 |

HYLAND BIZOT, *Primary Examiner.*